(12) United States Patent
Shinagawa et al.

(10) Patent No.: US 12,300,477 B2
(45) Date of Patent: May 13, 2025

(54) AUTONOMOUS OPERATION OF PLASMA PROCESSING TOOL

(71) Applicant: Tokyo Electron Limited, Tokyo (JP)

(72) Inventors: Jun Shinagawa, Fremont, CA (US); Toshihiro Kitao, Sapporo (JP); Chungjong Lee, Tokyo (JP); Masaki Kitsunezuka, Sapporo (JP); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 320 days.

(21) Appl. No.: 17/730,751

(22) Filed: Apr. 27, 2022

(65) Prior Publication Data
US 2023/0352282 A1 Nov. 2, 2023

(51) Int. Cl.
*H01J 37/32* (2006.01)
*H01L 21/3065* (2006.01)
*H01L 21/311* (2006.01)
*H01L 21/66* (2006.01)

(52) U.S. Cl.
CPC .. *H01J 37/32963* (2013.01); *H01J 37/32926* (2013.01); *H01J 37/32972* (2013.01); *H01L 21/3065* (2013.01); *H01L 21/31116* (2013.01); *H01L 22/10* (2013.01); *H01L 22/12* (2013.01); *H01L 22/14* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 6,896,763 B2 | 5/2005 | Balasubramhanya et al. |
| 8,362,949 B2 | 1/2013 | Yang et al. |
| 8,368,741 B2 | 2/2013 | Jelley et al. |
| 8,928,587 B1 | 1/2015 | Smus |
| 8,979,271 B2 | 3/2015 | Pletcher et al. |
| 9,097,800 B1 | 8/2015 | Zhu |
| 9,140,555 B1 | 9/2015 | Andersson et al. |
| 9,344,639 B2 | 5/2016 | Musatenko et al. |
| 9,386,230 B1 | 7/2016 | Duran et al. |
| 9,404,756 B2 | 8/2016 | Fong et al. |
| 9,462,423 B1 | 10/2016 | Rivlin et al. |
| 9,549,124 B2 | 1/2017 | Duran et al. |

(Continued)

OTHER PUBLICATIONS

H.K. Lee et al., "Resolving critical dimension drift over time in plasma etching through virtual metrology based wafer-to-wafer control", Japanese Journal of Applied Physics, vol. 56, paper#066502. (Year: 2017).*

(Continued)

*Primary Examiner* — Jiong-Ping Lu
(74) *Attorney, Agent, or Firm* — Oblon, McClelland, Maier & Neustadt, L.L.P.

(57) ABSTRACT

A method of operating a plasma tool includes executing a plasma process on a wafer. Data associated with the plasma process are measured using a plurality of sensors while the plasma process is executed on the wafer. The plasma process is terminated at an endpoint time. A post-process fault detection is executed by determining whether a post-process wafer state is within a target range. When the post-process wafer state is outside the target range so that a fault is detected, the fault is corrected using the data associated with the plasma process.

19 Claims, 10 Drawing Sheets

(56) References Cited

U.S. PATENT DOCUMENTS

| | | |
|---|---|---|
| 9,607,226 B2 | 3/2017 | Zhu et al. |
| 9,613,423 B2 | 4/2017 | Dixon et al. |
| 9,654,700 B2 | 5/2017 | Kovtun et al. |
| 9,661,466 B1 | 5/2017 | Andersson et al. |
| 9,678,102 B2 | 6/2017 | Ho et al. |
| 9,746,852 B1 | 8/2017 | Watts et al. |
| 9,821,463 B2 | 11/2017 | Kuffner, Jr. et al. |
| 9,838,602 B2 | 12/2017 | Duran et al. |
| 9,852,156 B2 | 12/2017 | Petrou et al. |
| 10,008,003 B2 | 6/2018 | Kirmani et al. |
| 10,120,057 B1 | 11/2018 | Byrne et al. |
| 10,209,062 B1 | 2/2019 | Le Grand |
| 10,249,047 B2 | 4/2019 | Jia et al. |
| 10,268,321 B2 | 4/2019 | Poupyrev |
| 10,330,489 B1 | 6/2019 | Andersson et al. |
| 10,346,463 B2 | 7/2019 | Petrou et al. |
| 10,401,490 B2 | 9/2019 | Gillian et al. |
| 10,459,080 B1 | 10/2019 | Schwesig et al. |
| 10,482,379 B2 | 11/2019 | Holt et al. |
| 10,488,523 B2 | 11/2019 | Watts et al. |
| 10,496,182 B2 | 12/2019 | Lien et al. |
| 10,565,732 B2 | 2/2020 | Zhao et al. |
| 10,641,613 B1 | 5/2020 | Andersson et al. |
| 10,664,061 B2 | 5/2020 | Poupyrev |
| 10,754,419 B2 | 8/2020 | Chung et al. |
| 10,802,147 B2 | 10/2020 | Nerurkar et al. |
| 10,818,105 B1 | 10/2020 | Konrardy et al. |
| 2019/0049937 A1* | 2/2019 | Tetiker ............... H01L 21/3065 |
| 2019/0321719 A1 | 10/2019 | Gillian et al. |
| 2020/0226742 A1* | 7/2020 | Sawlani ............ H01L 21/67288 |
| 2021/0027117 A1 | 1/2021 | McGavran et al. |
| 2021/0116896 A1 | 4/2021 | Arabshahi et al. |

OTHER PUBLICATIONS

Federico Castanedo, "A Review of Data Fusion Techniques", Hindawi Publishing Corporation, the Scientific World Journal, Article ID: 704504, 2013, 19 pages.

* cited by examiner

AUTONOMOUS OPERATION OF PLASMA PROCESSING TOOL

INCORPORATION BY REFERENCE

Aspects of the present disclosure are related to Applicant's co-pending U.S. patent application Ser. No. 17/710,085, filed on Mar. 31, 2022, which is incorporated herein by reference in its entirety.

FIELD OF THE INVENTION

This disclosure relates to semiconductor fabrication.

BACKGROUND

Device formation within microelectronic workpieces typically involves a series of manufacturing techniques related to the formation, patterning and removal of a number of layers of materials on a substrate. To meet the physical and electrical specifications of current and next generation semiconductor devices, process flows are being developed to reduce feature size while maintaining structure integrity for various patterning processes. Particularly, plasma processing plays a vital role in the deposition and removal of materials in the production of semiconductor devices. Typical examples include plasma-assisted chemical vapor deposition, plasma-assisted physical vapor deposition, plasma etch, plasma cleaning, etc.

SUMMARY

Aspect (1) includes a method of operating a plasma tool. The method includes executing a plasma process on a wafer. Data associated with the plasma process are measured using a plurality of sensors while the plasma process is executed on the wafer. The plasma process is terminated at an endpoint time. A post-process fault detection is executed by determining whether a post-process wafer state is within a target range. When the post-process wafer state is outside the target range so that a fault is detected, the fault is corrected using the data associated with the plasma process.

Aspect (2) includes the method of Aspect (1), further including executing a pre-process fault detection, before the executing the plasma process on the wafer, by a wafer measurement to determine whether an initial wafer state meets a preset requirement. The plasma process is executed on the wafer when the initial wafer state meets the preset requirement.

Aspect (3) includes the method of Aspect (2), further including repeating the wafer measurement, after the terminating the plasma process at the endpoint time, to obtain a first wafer state.

Aspect (4) includes the method of Aspect (3), further including estimating a second wafer state using the initial wafer state and the data associated with the plasma process.

Aspect (5) includes the method of Aspect (4), further including obtaining a duration of the plasma process by estimating the endpoint time using a group of in-situ sensor data that are measured by a group of in-situ sensors of the plurality of sensors and are associated with an endpoint process step of the plasma process. A process rate is obtained by using a virtual metrology (VM) model that is configured to estimate the process rate using the data associated with the plasma process.

Aspect (6) includes the method of Aspect (5), wherein the plasma process includes a plasma etching process. The duration of the plasma process includes an etch duration. The process rate includes an etch rate. The second wafer state includes a second critical dimension (CD) that is estimated using an initial CD, the etch duration and the etch rate.

Aspect (7) includes the method of Aspect (4), further including obtaining the post-process wafer state using an integrated estimation method that is configured to estimate the post-process wafer state using the first wafer state and the second wafer state.

Aspect (8) includes the method of Aspect (3), further including measuring a reflectivity of the wafer by the wafer measurement. A test model is provided that estimates a CD based on the reflectivity. The initial wafer state is obtained using the test model. The initial wafer state includes an initial CD. The first wafer state is obtained using the test model. The first wafer state includes a first CD.

Aspect (9) includes the method of Aspect (1), further including measuring the post-process wafer state outside a processing chamber associated with the plasma process.

Aspect (10) includes the method of Aspect (9), wherein the measuring the post-process wafer state includes measuring a CD ex situ by at least one of an atomic force microscope, a scanning electron microscope, a transmission electron microscope or a profilometer.

Aspect (11) includes the method of Aspect (1), further including estimating the endpoint time using a group of in-situ sensor data that are measured by a group of in-situ sensors of the plurality of sensors and are associated with an endpoint process step of the plasma process.

Aspect (12) includes the method of Aspect (11), further including inputting respective data measured by each in-situ sensor of the group of in-situ sensors into a respective individual endpoint detection (EPD) method to output a respective individual estimate of reaching an endpoint of the plasma process, which results in a group of individual estimates. The group of individual estimates is input into an integrated EPD method to output an integrated estimate of reaching the endpoint of the plasma process to estimate the endpoint time.

Aspect (13) includes the method of Aspect (11), wherein the group of in-situ sensors includes at least two of a spectrometer, an ellipsometer, a scatterometer, a reflectometer, a voltage and current (VI) probe, an optical emission spectrometry (OES) sensor, a plasma sensor, a mass spectrometer (MS) or a radio frequency (RF) sensor.

Aspect (14) includes the method of Aspect (1), further including determining the endpoint time before the executing the plasma process on the wafer.

Aspect (15) includes the method of Aspect (1), wherein the correcting the fault includes identifying a current failure mode using a classification model based on fused data. The fused data include the data associated with the plasma process. The classification model is configured to identify a plurality of failure modes associated with the plasma tool.

Aspect (16) includes the method of Aspect (15), wherein the correcting the fault includes, based on the current failure mode, at least one of adjusting a recipe for the plasma process, executing a seasoning process, performing a cleaning operation, performing maintenance work, replacing a consumable part of the plasma tool or adjusting a temperature in the plasma tool.

Aspect (17) includes the method of Aspect (15), wherein the correcting the fault includes, when the current failure mode is unidentifiable by the classification model, adjusting at least one recipe parameter based on the post-process wafer state using a process control model that describes a relationship between the post-process wafer state and the at least one recipe parameter.

Aspect (18) includes the method of Aspect (15), further including inputting respective data measured by each sensor of the plurality of sensors into a respective individual estimation method to output a respective individual wafer state of the wafer, which results in a plurality of individual wafer states. The plurality of individual wafer states is arranged into groups. Each group is input into a respective integrated estimation method to output a respective integrated wafer state of the wafer, which results in a plurality of integrated wafer states. The plurality of individual wafer states and the plurality of integrated wafer states are added to the fused data.

Aspect (19) includes the method of Aspect (1), wherein the post-process wafer state includes at least one of a critical dimension (CD), an etch rate, etch selectivity, an amount of remaining mask material, a deposition rate, a film thickness, a film chemical composition, a film reflectivity, film absorbance, film resistivity, film conductivity or the endpoint time.

Aspect (20) includes an apparatus. The apparatus includes a controller including a processor that is programmed to execute a plasma process on a wafer. The processor is programmed to measure data associated with the plasma process using a plurality of sensors while the plasma process is executed on the wafer. The processor is programmed to terminate the plasma process at an endpoint time. The processor is programmed to execute a post-process fault detection by determining whether a post-process wafer state is within a target range. When the post-process wafer state is outside the target range so that a fault is detected, the processor is programmed to correct the fault using the data associated with the plasma process.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1:
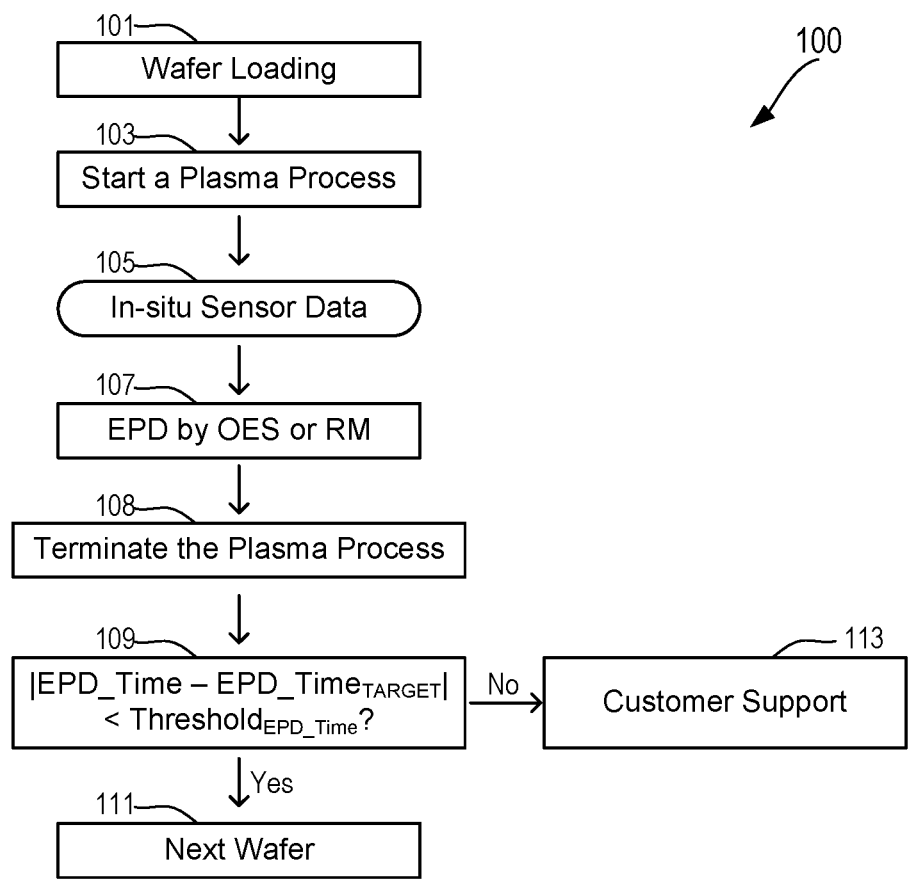
FIG. 1 (background art) shows a diagram of a process of operating a plasma tool, in related examples.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

As noted in the Background, plasma processing tools (hereinafter referred to as plasma tools) are widely used in the manufacture of microelectronic devices. Typically, a plasma-related process (hereinafter referred to as a plasma process) is executed on a wafer in a processing or plasma chamber (hereinafter referred to as a chamber) of the plasma tool. The plasma process can include, but is not limited to, film deposition, etching and/or cleaning. During the plasma process, tool conditions often change or drift over time, and even the slightest change in a critical parameter can sometimes lead to highly undesirable economic results. Meanwhile, small changes can easily occur in many aspects of a plasma tool, such as wafer chuck temperature, plasma gas pressure, etch gas composition, chamber wall stickiness and the like. Therefore, it is important to monitor the plasma process and the wafer for a variety of purposes, including fault detection, endpoint detection, etc. Faults can include any events that would induce a process to go out of control limits.

Conventional monitoring for the purposes of fault detection, endpoint detection, etc. is usually accomplished by using a sensor installed in the plasma tool. The sensor can, for example, measure a plasma parameter (such as a plasma species concentration) or a wafer characteristic (such as a film reflectivity). The parameter measured by the sensor is thus used to monitor the process and/or the wafer. Depending on a single sensor, such monitoring can be inaccurate and unreliable, especially when a fault or failure occurs with this single sensor.

In one related example, a single sensor such as a spectrometer is used for endpoint detection (EPD). Data collected by the spectrometer are used as an input for an individual EPD method which is configured to estimate and output an output signal, such as a probability of reaching an endpoint, or whether or not the endpoint has been reached. When the spectrometer malfunctions, the endpoint cannot be accurately determined. More importantly, such a malfunction may not be detected until after having caused substantial economic loss. In another related example, a plurality of individual EPD methods is used for a single sensor, and an integrated EPD method is configured to estimate and output the output signal. By providing multiple individual EPD methods (or algorithms), robust EPD is rendered possible with more than one algorithm. However, EPD will still fail if the sensor malfunctions.

Alternatively, multiple sensors can be used in conventional monitoring, but the multiple sensors are usually used individually for specific application needs. For example, in a plasma etch system, an endpoint can be detected both using optical emission spectroscopy (OES) signals for applications where an etching process continues down to a stop layer and using a spectroscopic reflectometer for applications where an etching process ends at the middle of an etching layer. In addition, endpoint signals can be detected with voltage (V), current (I) or phase of VI using a VI probe, or impedance measured by RF match box as disclosed in U.S. Pat. No. 6,599,759. Nevertheless, such systems often fail to detect sensor faults, and wafers are scrapped when a failure in the wafer state detection system (e.g. an endpoint detection system) is undetected during the process.

The Applicant's co-pending U.S. patent application Ser. No. 17/710,085 (incorporated herein by reference in its entirety) discloses a method that enables data fusion of multiple sensors, such as a plurality of in-situ sensors. Various data can be measured or collected by the multiple sensors while a process is executed on a wafer in the plasma tool. Instead of utilizing and processing the various data individually to monitor the process and/or the wafer, an integrated estimation method is leveraged that can be configured to estimate and output an integrated wafer state using at least the various data. By integrating the various data measured by the multiple sensors, the wafer state can be robustly monitored even when one or more sensors fail. Such date fusion can also enable detection of wafer condition defects (e.g. deterioration of etch rate, process non-uniformity, etc.), which could not be detected by a single sensor or by multiple sensors whose data are individually utilized. Moreover, such date fusion allows for detection of sensor malfunctions or faults, which is often elusive in related technology and yet highly important for wafer monitoring.

FIG. 1 (background art) shows a diagram of a process 100 of operating a plasma tool in related examples. In Block 101, a wafer is loaded into the plasma tool. In Block 103, a plasma process is started. Meanwhile, in-situ sensor data 105 are collected, such as optical emission spectrometry (OES) data or reflectometer (RM) data. In Block 107, endpoint detection (EPD) is implemented using the OES data or the RM data to obtain an endpoint time (noted as EPD_Time) of the plasma process. Note that conventional EPD usually utilizes the OES data alone or utilizes the RM data alone, without integrating the OES data and the RM data. In Block 108, the plasma process is terminated at the endpoint time, EPD_Time. In other related examples (not shown), it may not be sensible or practicable to implement EPD using in-situ data. Instead, metrology measurements can be used to implement process control to obtain EPD_Time. In Block 109, EPD_Time is compared with a target endpoint time (noted as EPD_Time$_{TARGET}$). Threshold$_{EPD\_Time}$ is a pre-determined threshold value for the endpoint time. If |EPD_Time−EPD_Time$_{TARGET}$|<Threshold$_{EPD\_Time}$, the process 100 proceeds to Block 111 by continuing to a next wafer. Otherwise, a fault is detected, and the process 100 proceeds to Block 113 by seeking customer support, which often entails notifying the manufacturer of the plasma tool, submitting a work request thereto, etc. Seeking such customer support can often cost time and money and cause a prolonged delay in production.

By contrast, in autonomous operation, fault detection and classifications (FDC) as well as advanced process control (APC) systems can be used to detect and address faults. Specifically, FDC can be used to detect and classify faults and determine the best course of action for correcting the faults, including utilizing APC. APC can be used to tune control knobs to keep operation within the control limits. Autonomous operation often requires sensor data of high reliability and accuracy, which can improve reliability and accuracy of FDC and APC systems. Moreover, high-quality sensor data can enable FDC without necessitating high-volume data, advanced algorithms or accuracy improvement in virtual metrology (VM) models, by which fault detection is often implemented.

According to some aspects of the disclosure, quality of sensor data can be improved by selecting a set of plasma diagnostic sensors that measure electrical, physical and/or chemical characteristics of plasma as well as sensors that can measure wafer properties. Reliability can be improved by minimizing or eliminating measurement errors in the selected sensors. Data fusion methods, such as those disclosed in the Applicant's co-pending U.S. patent application Ser. No. 17/710,085 (incorporated herein by reference in its entirety), can be applied to improve data quality as well as data reliability.

Techniques herein disclose a classification and process control module enabled by data fusion. During a plasma process, various data, including in-situ sensor data and module sensor data, are collected by a plurality of sensors, including in-situ sensors and module sensors. The various data go through a data fusion process so that fused data can be input into a classification model and/or a process control model of the classification and process control module. The classification model can be configured to identify a current failure mode (or probable fault class) and provide or suggest a corrective action accordingly. The process control model can be implemented by virtual metrology (VM) and configured to determine or suggest recipe adjustment based on irregular data associated with a detected fault of the plasma tool. Ergo, when a fault is detected in a plasma tool, the classification and process control module can be leveraged to identify the fault and provide a solution without necessitating customer support, therefore enabling autonomous operation.

Aspects of the disclosure include a data fusion process for obtaining a wafer state, such as a critical dimension (CD) of a wafer (e.g. a wafer profile), after a plasma process. In the data fusion process, a group of in-situ sensor data are collected and used to determine an endpoint time of the plasma process, for example using a method disclosed in the Applicant's co-pending U.S. patent application Ser. No. 17/710,085 (incorporated herein by reference in its entirety). As a result, duration of the plasma process can be determined. A VM model is configured to estimate a process rate, such as an etch rate, using data measured during the plasma process. Consequently, a change in the CD as a result of the plasma process can be determined by the duration of the plasma process and the etch rate. The CD after the plasma process (e.g. a post-process profile) can thus be derived from the CD before the plasma process (e.g. a pre-process profile) and the change in the CD.

Figure 2:
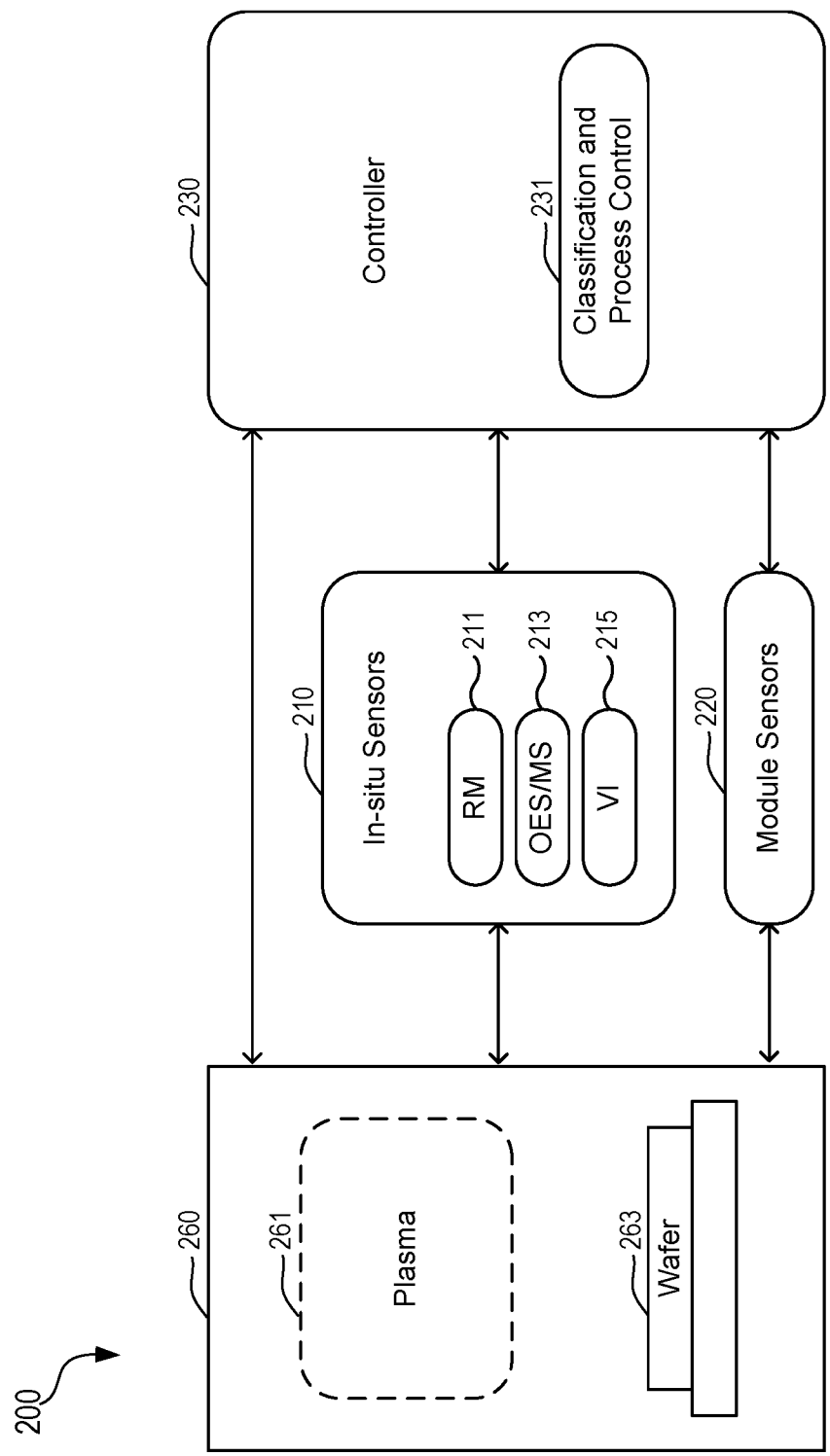
FIG. 2 shows a schematic of a system for autonomous operation of a plasma tool, in accordance with some embodiments of the present disclosure.

FIG. 2 illustrates a schematic of a system 200 for autonomous operation of a plasma tool, in accordance with some embodiments of the present disclosure. As shown, a plasma process involving a plasma 261 is executed on a wafer 263 in a chamber 260 of the plasma tool. A plurality of sensors, including in-situ sensors 210 and module sensors 220, is used to monitor the plasma process by measuring data associated with the plasma process while the plasma process is executed on the wafer 263. The system 200 can further include a controller 230 having a classification and process control module 231. The controller 230 can be configured to receive data from the in-situ sensors 210 and the module sensors 220 and determine whether there is a fault, which will be explained later in detail. When there is a fault, the classification and process control module 231 can be configured to identify a current failure mode (or probable fault class) and provide or suggest a corrective action. The controller 230 may further be configured to implement the corrective action, which will be explained later in detail, for example by advanced process control (APC).

In this example, the in-situ sensors 210 include a group including a reflectometer (RM) 211, OES/MS 213 (i.e. an optical emission spectrometry (OES) sensor, a mass spectrometer (MS), or both an OES sensor and an MS) and VI 215 (i.e. a voltage and current (VI) probe). Specifically, the RM 211 can be used to study geometric and optical properties of a surface of the wafer 263. Since a laser of the RM 211 is applied to the center of the wafer 263, data measured by the RM data may include relatively more information about the center of the wafer 263. The OES/MS 213 (hereinafter referred to as an OES/MS sensor 213) can be used for looking at the chemistry of the plasma 261 and/or the chemical composition of the wafer 263. Data measured by the OES/MS sensor 213 can for example provide information regarding radical species in the plasma 261, elements of a film on the wafer 263 and the like. The VI 215 (hereinafter referred to as a VI probe 215) can be used to study electrical properties of the plasma such as an overall density of the plasma. Data measured by the VI probe 215 may reveal information about the (entire) wafer 263. As can be appreciated, RM data, OES/MS data and VI data include different information which may be complementary to each other. Rather than use the RM data, the OES/MS data and the VI data individually, an integrated estimation method can be expected to improve accuracy and reliability. While not shown, the module sensors 220 can include a pressure manometer, a gas flow meter, an RF power meter, a pump vacuum sensor and/or the like.

A "sensor" used herein generally refers to any device, machine, module or subsystem that detects or measures a physical, electrical or chemical property in an environment and provides a representation of the physical, electrical or chemical property. For instance, the sensor can produce an output signal which contains information pertaining to the physical, electrical or chemical property of a plasma in a plasmas tool. The sensor can include an in-situ sensor which is exposed to a processing environment associated with a plasma process. For example, the in-situ sensor can be exposed to the plasma through an optical lens for an optical emission spectrometry (OES) sensor or exposed through an RF feed rod for a voltage and current (VI) sensor/probe. The in-situ sensor can be located inside (e.g. mounted onto) the chamber or located outside the chamber. The in-situ sensor can be configured to sense a process inside the chamber, e.g. a spectrometer such as an OES sensor. The in-situ sensor can also be configured to sense a system attached to the chamber. For example, a VI probe measures voltage and current on an RF feed line to a plasma chamber. The in-situ sensor can include, but is not limited to, a spectrometer, an ellipsometer, a scatterometer, a reflectometer (RM), a VI probe, an OES sensor, a plasma sensor, a mass spectrometer (MS) or a radio frequency (RF) sensor. Additionally, the sensor can include a module sensor, such as a pressure manometer, a gas flow meter, an RF power meter or a pump vacuum sensor. An in-situ sensor is often used to characterize a plasma or a wafer whereas a module sensor is often used to characterize parameters related to a module associated with a plasmas tool.

In the following descriptions, FIGS. 3A-3D illustrate four embodiments of autonomous operation, e.g. autonomous operation of the system 200. Note that similar or identical components are labeled with similar or identical numerals throughout FIGS. 3A-3D unless specified otherwise. A plasma etching process will be used as an example throughout FIGS. 3A-3D and FIGS. 4-6 for illustrative purposes.

Figure 3A:
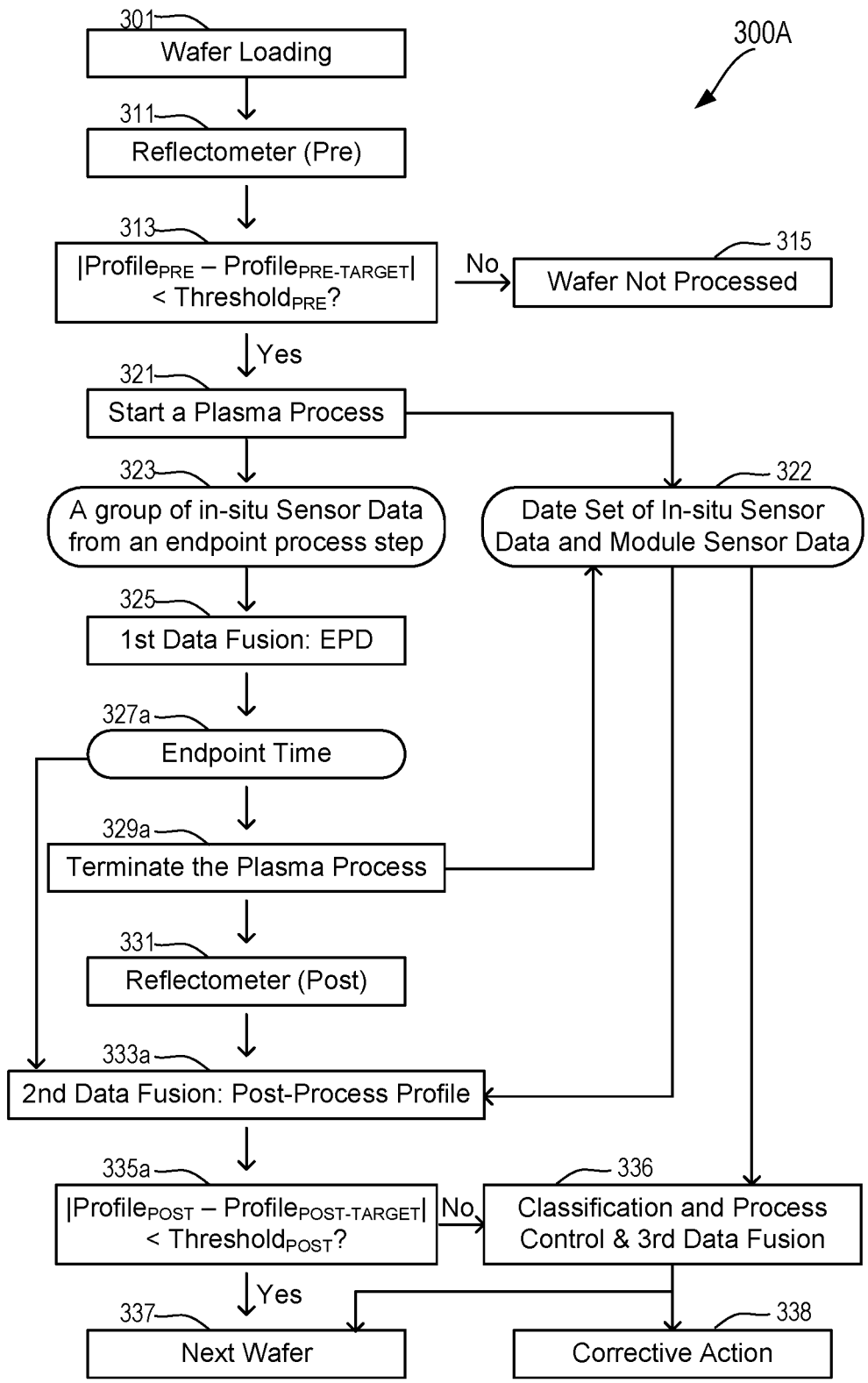
FIG. 3A shows a diagram of a process of autonomous operation of a plasma tool, in accordance with one embodiment of the present disclosure.

FIG. 3A shows a diagram of a process 300A of autonomous operation of a plasma tool, in accordance with one embodiment of the present disclosure. In Block 301, a wafer (e.g. the wafer 263) is loaded into a plasma tool or transferred into a chamber (e.g. the chamber 260) of the plasma tool. Then, a pre-process fault detection can be executed to determine whether an initial wafer state meets a preset requirement. In the example of Block 311, a reflectometer (RM) is used to measure a reflectivity of the wafer. A test model (not shown in FIG. 3A but will be shown as 303 in FIG. 5) that estimates a profile of the wafer based on the reflectivity is provided or pre-built. As a result, a pre-process profile (noted as $Profile_{PRE}$) can be obtained using the test model. In Block 313, the pre-process profile is compared with a target pre-process profile (noted as $Profile_{PRE\_TARGET}$). $Threshold_{PRE}$ is a pre-determined threshold value for the pre-process profile. If a pre-set requirement, $|Profile_{PRE} - Profile_{PRE\_TARGET}| < Threshold_{PRE}$, is met, the process 100 proceeds to Block 321. Otherwise, the process 100 proceeds to Block 315 where the wafer is not processed for failing to meeting the preset requirement. It should be understood that other characterization techniques or wafer measurement can also be used for the pre-process fault detection.

In Block 321, a plasma process, such as a plasma etching process, is started and executed on the wafer. The plasma etching process may include a plurality of process steps, such as a pre-heating process step, a plasma generating process step, a transitional etching process step for etching an intermediate layer (e.g. a capping layer, an anti-reflective coating, etc.), an endpoint process step for etching a layer of interest (e.g. a photoresist film, a dielectric film, a metal film, etc.) and the like. In other words, the endpoint process step among the plurality of process steps is relevant for determining an endpoint of the plasma etching process. Accordingly, a group of in-situ sensor data 323 from the endpoint process step are collected by a group of in-situ sensors (e.g. the RM 211, the OES/MS sensor 213 and the VI probe 215) while the plasma etching process is executed on the wafer. In Block 325, a first data fusion process for the group of in-situ sensor data 323 is executed in order to determine an endpoint time 327a of the plasma etching process. For instance, the first data fusion process can be implemented using techniques disclosed in the Applicant's co-pending U.S. patent application Ser. No. 17/710,085 (incorporated herein by reference in its entirety).

Figure 4:
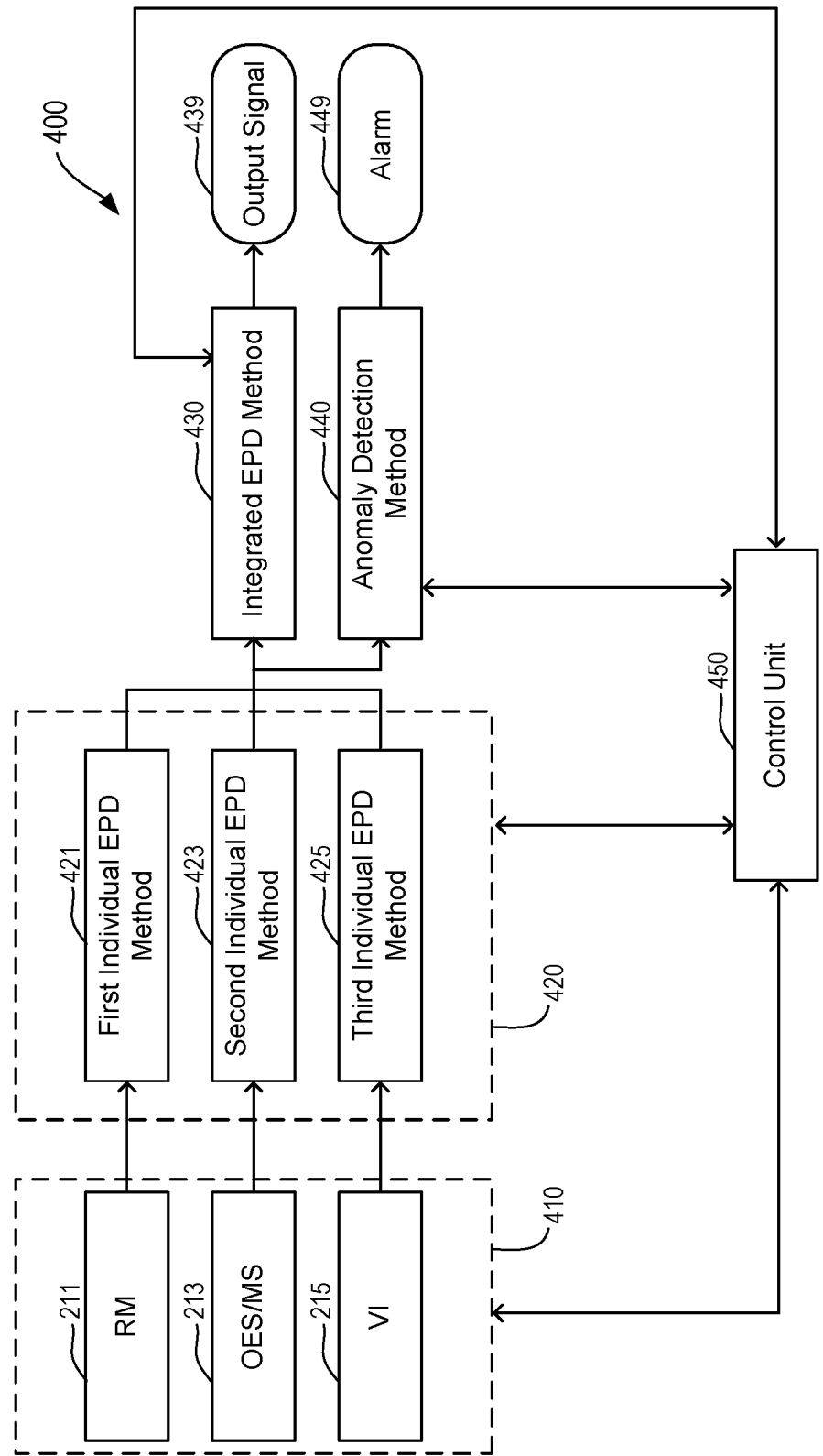
FIG. 4 shows a diagram of a data fusion process for endpoint detection, in accordance with some embodiments of the present disclosure.

FIG. 4 shows one example 400 of the first data fusion process for endpoint detection (EPD). As illustrated, a group of in-situ sensors 410, including the RM 211, the OES/MS sensor 213 and the VI probe 215, are used. Specifically, RM data are input into a first individual EPD method 421 to output a first individual EPD estimate. OES/MS data are input into a second individual EPD method 423 to output a second individual EPD estimate. VI data are input into a third individual EPD method 425 to output a third individual EPD estimate. An integrated EPD method 430 is configured to estimate an integrated EPD estimate using the first, second and third individual EPD estimates. An output signal 439 can include whether the plasma etching process has reached an endpoint or a probability of reaching the endpoint in order to determine the endpoint time 327a. An anomaly method 440 can be configured to receive the individual EPD estimates as an input and output an alarm 449 when an anomaly is detected by the anomaly method 440. Further, a control unit 450 can be configured to be coupled to various components of the example 400 of the first data fusion process to receive inputs from and provide outputs to the components, such as the group of in-situ sensors 410, individual EPD methods 420 (e.g. 421, 423 and 425), the integrated EPD method 430 and the anomaly method 440. The control unit 450 can for example be part of or be included by the controller 230. Note that this is merely an overview of the example 400. More details regarding the first data fusion process and variations thereof are disclosed in the Applicant's co-pending U.S. patent application Ser. No. 17/710,085 (incorporated herein by reference in its entirety).

Referring back to FIG. 3A, after the endpoint time 327a is obtained, the plasma (etching) process is terminated in Block 329a. Note that a data set 322 of in-situ sensor data and module sensor data is also collected while the plasma etching process is executed, i.e. between Block 321 and Block 329a. For example, the data set 322 can be collected for various or all process steps of the plasma etching process by the in-situ sensors 210 and the module sensors 220. It should be understood that the group of in-situ sensor data 323 are included by the data set 322. While the group of in-situ sensor data 323 are related to the endpoint process step, the data set 322 can be associated with or related to the (entire) plasma etching process.

After the plasma (etching) process is terminated in Block 329a, a post-process fault detection is executed by determining whether a post-process wafer state is within a target range. In the example of Block 331, RM measurement is repeated to measure the reflectivity of the wafer. In Block 333a, a second data fusion process is executed to estimate a post-process profile (noted as $\text{Profile}_{POST}$ in FIG. 3A and 334 in FIG. 5).

Figure 5:
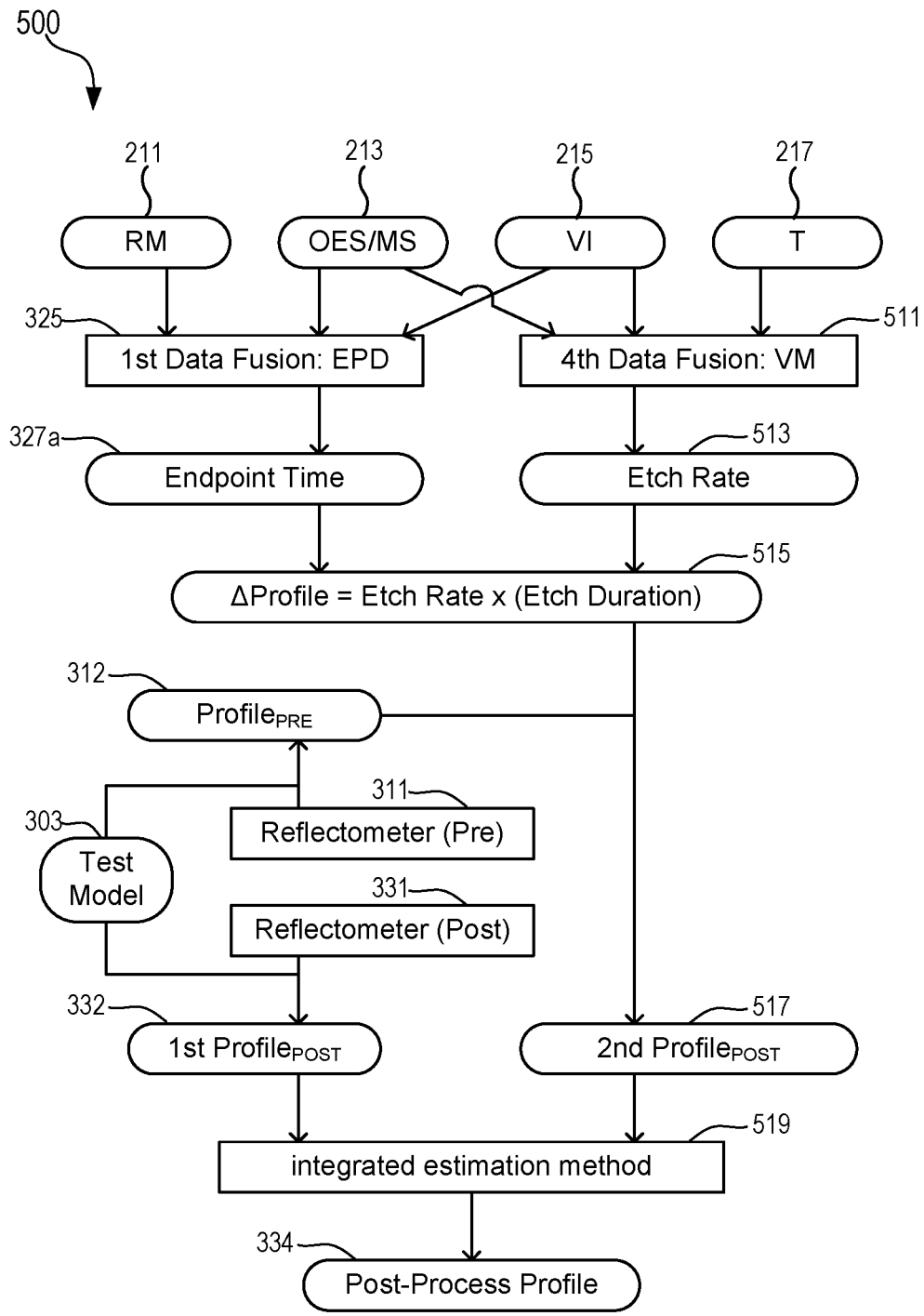
FIG. 5 shows a diagram of a data fusion process for determining a post-process profile, in accordance with some embodiments of the present disclosure.

FIG. 5 shows one example 500 of the second data fusion process for determining the post-process profile. As illustrated, the RM 211, the OES/MS sensor 213 and the VI probe 215 can be used to estimate the endpoint time 327a by the first date fusion process. Therefore, an etch duration can be determined by the endpoint time 327a. Besides, a wafer temperature (T) 217 can be determined and used in conjunction with OES/MS data and VI data for a fourth data fusion process in order to determine an etch rate (ER) 513. A change in a wafer profile, noted as ΔProfile 515, can thus be determined by the etch duration and the etch rate 513. For instance, ΔProfile 515=the etch duration x the etch rate 513. Alternatively, ΔProfile 515=∫(the etch rate 513)dt, where dt is a time derivative, and start and end values of the integral are determined by the endpoint time 327a or the etch duration.

While not shown in detail in Block 511, instead of only relying on metrology to measure ER, virtual metrology (VM) can be used to estimate ER using in-situ sensor data. The process of ER estimation by VM can also be considered to be a data fusion process (e.g. a fourth data fusion process) when using data measured by more than one in-situ sensor, such as the OES/MS sensor 213 and the VI probe 215. In one embodiment, the fourth data fusion process can be similar to the example 400 of the first data fusion process. That is, the OES/MS data, the VI data and T can each be input into a respective individual ER method to output a respective individual estimate of ER, which results in a plurality of individual estimates. Then, the plurality of individual estimates is input into an integrated ER method to output an integrated estimate of the etch rate 513.

Still referring to FIG. 5, an RM measurement is executed both in Block 311 (i.e. before the plasma etching process) and in Block 331 (i.e. after the plasma etching process). A test model 303 is provided and used to estimate a wafer profile based on the RM measurement. Herein, the test model 303 is used after Block 311 to estimate $\text{Profile}_{PRE}$ 312 (i.e. the pre-process profile, $\text{Profile}_{PRE}$ used in Block 313). The test model 303 is also used after Block 331 to estimate a first $\text{Profile}_{POST}$ 332, i.e. a first (post-process) wafer state. Further, a second $\text{Profile}_{POST}$ 517, i.e. a second (post-process) wafer state, can be derived from $\text{Profile}_{PRE}$ 312 and ΔProfile 515. For instance, the second $\text{Profile}_{POST}$ 517=$\text{Profile}_{PRE}$ 312+ΔProfile 515. Subsequently in Block 519, an integrated method is configured to estimate a post-process profile 334 based on the first $\text{Profile}_{POST}$ 332 and the second $\text{Profile}_{POST}$ 517. For example, the integrated method can be similar to the integrated EPD method 430. The post-process profile 334 may be an average value of the first $\text{Profile}_{POST}$ 332 and the second $\text{Profile}_{POST}$ 517.

Referring back to FIG. 3A, the post-process profile 334 (noted as $\text{Profile}_{POST}$) is compared with a target post-process profile (noted as $\text{Profile}_{POST}$ TARGET) in Block 335a. $\text{Threshold}_{POST}$ is a pre-determined threshold value for the post-process profile. If $|\text{Profile}_{POST} - \text{Profile}_{POST\_TARGET}| < \text{Threshold}_{POST}$, the process 100 proceeds to Block 337 by continuing to a next wafer. Otherwise, a fault is detected, and the process 100 proceeds to Block 336 where a third data fusion process is executed for a classification and process control module (e.g. the classification and process control module 231). The classification and process control module is configured to suggest or provide a corrective action for the fault detected using the data set 322. In Block 338, the corrective action is executed to correct the fault.

Figure 6:
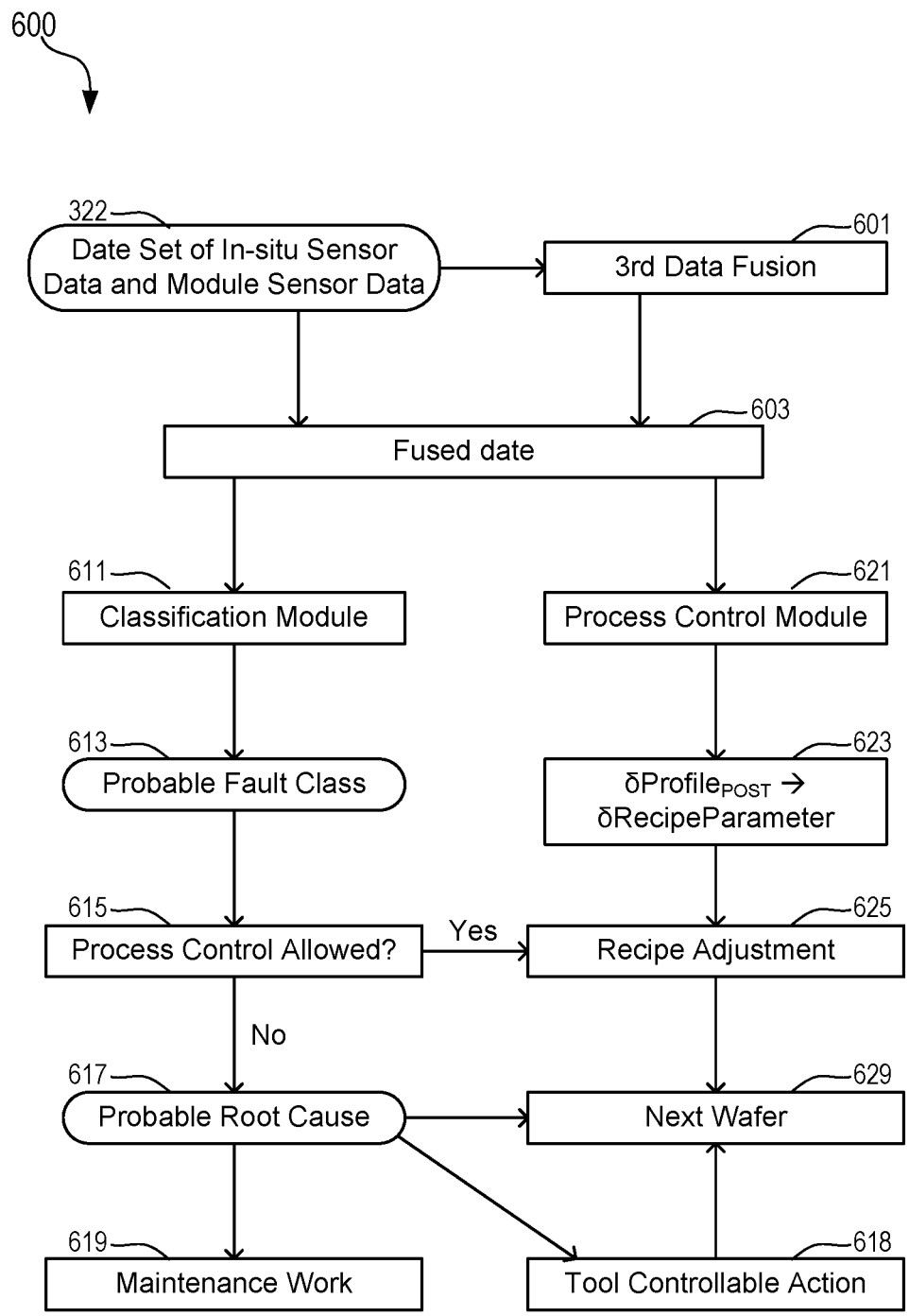
FIG. 6 shows a diagram of a classification and process control module involving data fusion, in accordance with some embodiments of the present disclosure.

FIG. 6 shows one example of a classification and process control module 600, which can be used in Block 336 and/or correspond to the classification and process control module 231. Herein, the data set 322 of in-situ sensor data and module sensor data can go through a third data fusion process in Block 601. While not shown, the third data fusion process can be similar to the example 400 of the first data fusion process. Specifically, respective data measured by each sensor can be input into a respective individual estimation method to output a respective individual estimate, which results in a plurality of individual wafer states. Note that the plurality of individual wafer states can then be arranged into groups (at least one individual wafer state may be in more than one group). Each group of individual wafer states can be input into a respective integrated estimation method to estimate a respective integrated wafer state, which results in a plurality of integrated wafer states. For example, the plurality of integrated wafer states can include the endpoint time 327a, the etch rate 513, and the like. Fusion outputs from the third data fusion process can thus include the plurality of individual wafer states, the plurality of integrated wafer states, and interaction terms thereof. The interaction terms can include a product, a division, an average, an integral and/or another mathematical operation of individual wafer states and/or integrated wafer states. For instance, the interaction terms can include ΔProfile 515, the post-process profile 334 and the like. Then, the data set 322 and the fusion outputs are added to fused data in Block 603.

In Block 611, the fused data are input into a classification module to output at least one probable fault class 613 (or current failure mode). The classification module includes a classification model that is capable of identifying a plurality of fault classes (or failure modes) associated with the plasma tool. While not shown, a list of fault classes which allow process controls can be provided or pre-determined. In Block 615, whether the at least one probable fault class 613 allows process control is evaluated, for example using the list. Fault classes or failure modes can include, but are not limited to, incoming wafer variation, a chamber fault (e.g. chamber wall build-up, temperature effect, a module fault, a consumable part, etc.), an algorithm fault, a sensor fault (e.g. a malfunctioning in-situ sensor, a malfunctioning module sensor, etc.) and the like.

When the at least one probable fault class 613 allows process control, the classification and process control module 600 proceeds to Block 625 where a recipe associated with the plasma etching process is adjusted. For instance, at least one recipe parameter of the recipe is adjusted, and at least one control knob of the plasma tool is adjusted. Then, the classification and process control module 600 proceeds to Block 629 by continuing to a next wafer.

When the at least one probable fault class 613 does not allow process control, an alarm or warning regarding post-process variations is generated. Meanwhile, at least one probable root cause 617 is determined by the classification model or by a user. The classification and process control module 600 then proceeds to Block 618 or Block 619, depending on the at least one probable root cause 617. If the at least one probable root cause 617 can be fixed by host/tool controllable actions, such actions are taken in Block 618. Such actions may include executing a seasoning process, performing a cleaning operation, replacing a consumable part of the plasma tool, adjusting a temperature in the plasma tool (e.g. warming up a chamber wall and/or an electrostatic chuck) and the like. In Block 619, maintenance work is performed on the plasma tool.

In Block 621, the fused data are input into a process control module that includes a process control model which can describe a relationship between the post-process profile 334 and at least one recipe parameter. Thus in Block 623, the process control model can be used to adjust the at least one recipe parameter based on the post-process profile 334. For instance, $\delta Profile_{POST}$ can be used to determine $\delta RecipeParameter$, where $\delta Profile_{POST} = Profile_{POST} - Profile_{POST\_TARGET}$, and $\delta RecipeParameter$ denotes a change in the at least one recipe parameter. Further, $\delta RecipeParameter$ can be used to determine $\delta ControlKnob$, where $\delta ControlKnob$ denotes a change in at least one control knob corresponding to the at least one recipe parameter. $\delta ControlKnob = (\text{control knob sensitivity}) \times \delta RecipeParameter$, for example. In Block 625, the recipe is adjusted based on $\delta RecipeParameter$.

In some embodiments, the fused data are first input into the classification module in Block 611 to identify the at least one probable fault class 613. However, if the at least one probable fault class 613 is unidentifiable, the fused data are then input into the process control module in Block 621 so as to adjust the at least one recipe parameter based on the post-process profile 334.

Note that the classification model can be provided by a third party or built by oneself, for example using methods disclosed in the Applicant's co-pending U.S. patent application Ser. No. 17/373,078, filed on Jul. 12, 2021, which is incorporated herein by reference in its entirety. Building the classification model can for instance include regression analysis that includes at least one of a logistic regression, a support vector machine regression, a decision tree regression or a linear regression. In one embodiment, the classification model includes a plurality of fault detection models, each of which can detect at least one failure mode. In another embodiment, the plurality of fault detection models is integrated into a single multi-class classification model by applying a machine learning algorithm.

Therefore, the classification model can be used to identify a current failure mode (or probable fault class) of the plasma tool when a fault occurs. Because model input can include both module sensor data and in-situ sensor data, in-situ sensor data are used to identify failure modes that cannot be directly monitored by module sensor data. For example, a first failure mode that is associated with RF power measurement for an RF generator can be identified directly with module sensor data while a second failure mode that is related to chamber wall condition variations cannot be identified with module sensor data alone. Thus, in-situ sensor data can be used to help identify the second failure mode.

Note that the process control model can be provided by a third party or built by oneself, for example using methods disclosed in the Applicant's co-pending U.S. patent application Ser. No. 17/350,439 filed on Jun. 17, 2021 and Ser. No. 17/025,651 filed on Sep. 18, 2020, both of which are incorporated herein by reference in their entireties. Specifically, the process control model can include a VM model and a control model. The VM model is configured to predict or estimate a wafer characteristic (or wafer state) resulting from a plasma process based on at least one plasma parameter while the control model describes a relationship between the at least one plasma parameter and at least one recipe parameter, for example as shown by FIG. 2 and descriptions thereof in the Applicant's co-pending U.S. patent application Ser. No. 17/350,439 (incorporated herein by reference in its entirety).

Figure 3B:
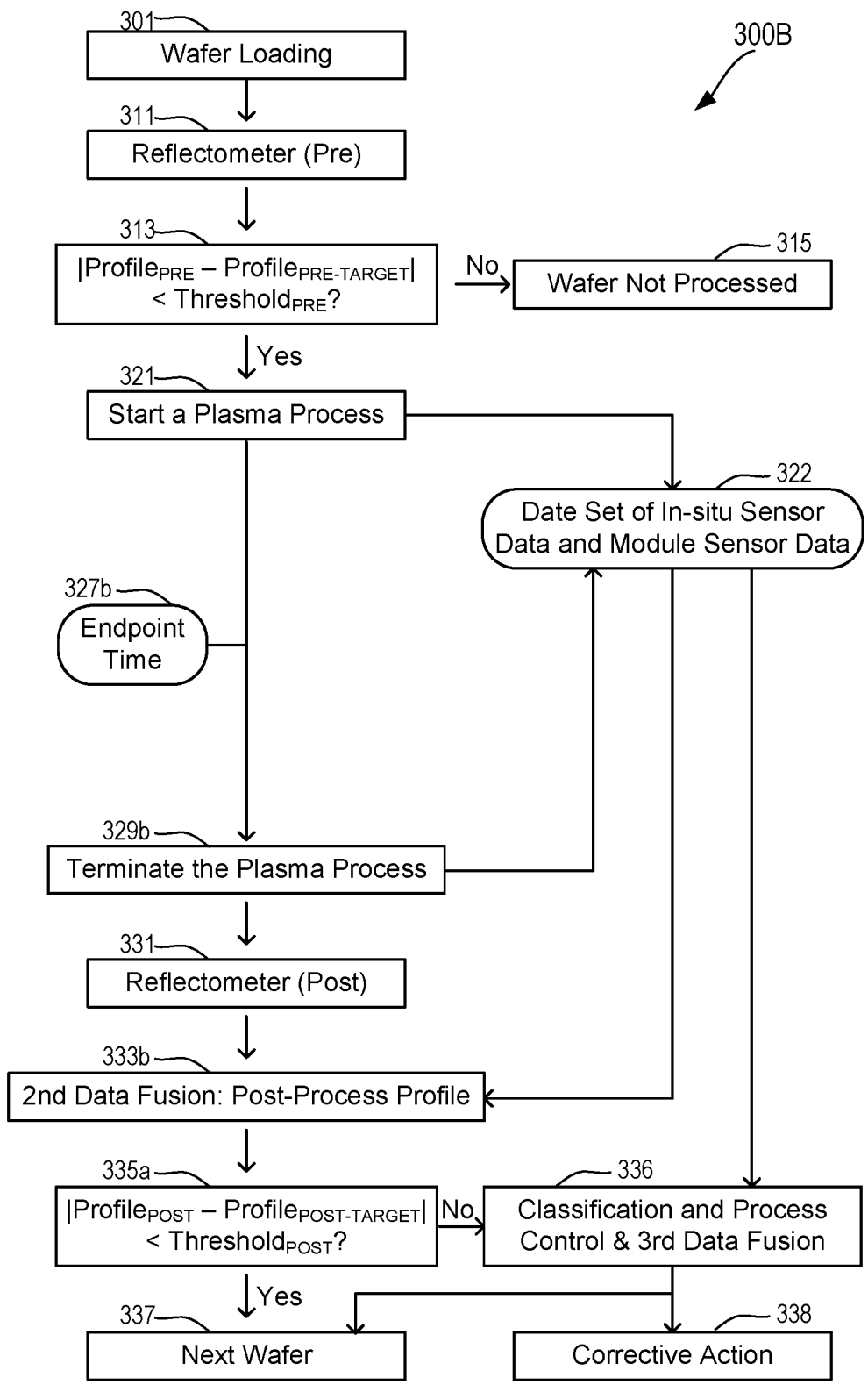
FIG. 3B shows a diagram of a process of autonomous operation of a plasma tool, in accordance with another embodiment of the present disclosure.

FIG. 3B shows a diagram of a process 300B of autonomous operation of a plasma tool, in accordance with another embodiment of the present disclosure. Since the embodiment of the process 300B is similar to the embodiment of the process 300A, explanations will be given here with emphasis placed on difference.

In Block 321, the plasma (etching) process is started. Nevertheless, the first data fusion processes is not executed to obtain the endpoint time 327a in the process 300B. Instead, an endpoint time 327b is pre-determined herein. For example, a range of endpoint times might have been obtained from previous plasma etching processes. The endpoint time 327b can be set to be above an upper limit of the range, therefore corresponding to "over-etching". In other words, the endpoint time 327b can be set to be later than the endpoint time 327a or a time when the endpoint process step is accomplished. The plasma etching process is then terminated at the endpoint time 327b in Block 329b.

In some embodiments, the plasma etching process involves selective and anisotropic etching chemistry. After the plasma etching process finishes etching the layer of interest and forms an opening, the plasma etching process will not continue to etch an underlying layer significantly due to selective chemistry. In the meantime, the plasma etching process, which is anisotropic or directional, will not widen the opening significantly. Ergo, the plasma etching process can be "effectively stopped" before terminated at the endpoint time 327b, with the "over-etching" configured to be negligible. Of course the endpoint time 327b should not be infinitely later than the endpoint time 327a, which may eventually cause the "over-etching" to be appreciable.

Subsequently, the RM measurement is executed in Block 331, followed by a second fusion process in Block 333b. In one embodiment, the second fusion process in Block 333b is similar to the second fusion process in Block 333a. While the endpoint time 327a is not used for Block 329b and not shown to be input into Block 333a in the process 300B, the endpoint time 327a may still be estimated during the second fusion process in FIG. 5 as the data set 322 includes the group of in-situ sensor data 323. In other words, the etch duration in FIG. 5 is based on the (estimated) endpoint time 327a rather than the endpoint time 327b at which the plasma etching process is actually terminated. The "over-etching" is configured to be negligible after all. In another embodiment, the second fusion process in Block 333b is different from the second fusion process in Block 333a in that the endpoint time 327a need not be estimated. Instead, the endpoint time 327b is used for estimating ΔProfile 515. As has been mentioned earlier, ΔProfile 515 can be calculated by the integral: ∫(the etch rate 513)dt. Herein, the etch rate 513 is a function of time, and the etch rate 513 can be negligible during the "over-etching" after the endpoint process step is finished. Thus, although the endpoint time 327b is used, ΔProfile 515 will not be overestimated or exaggerated.

Figure 3C:
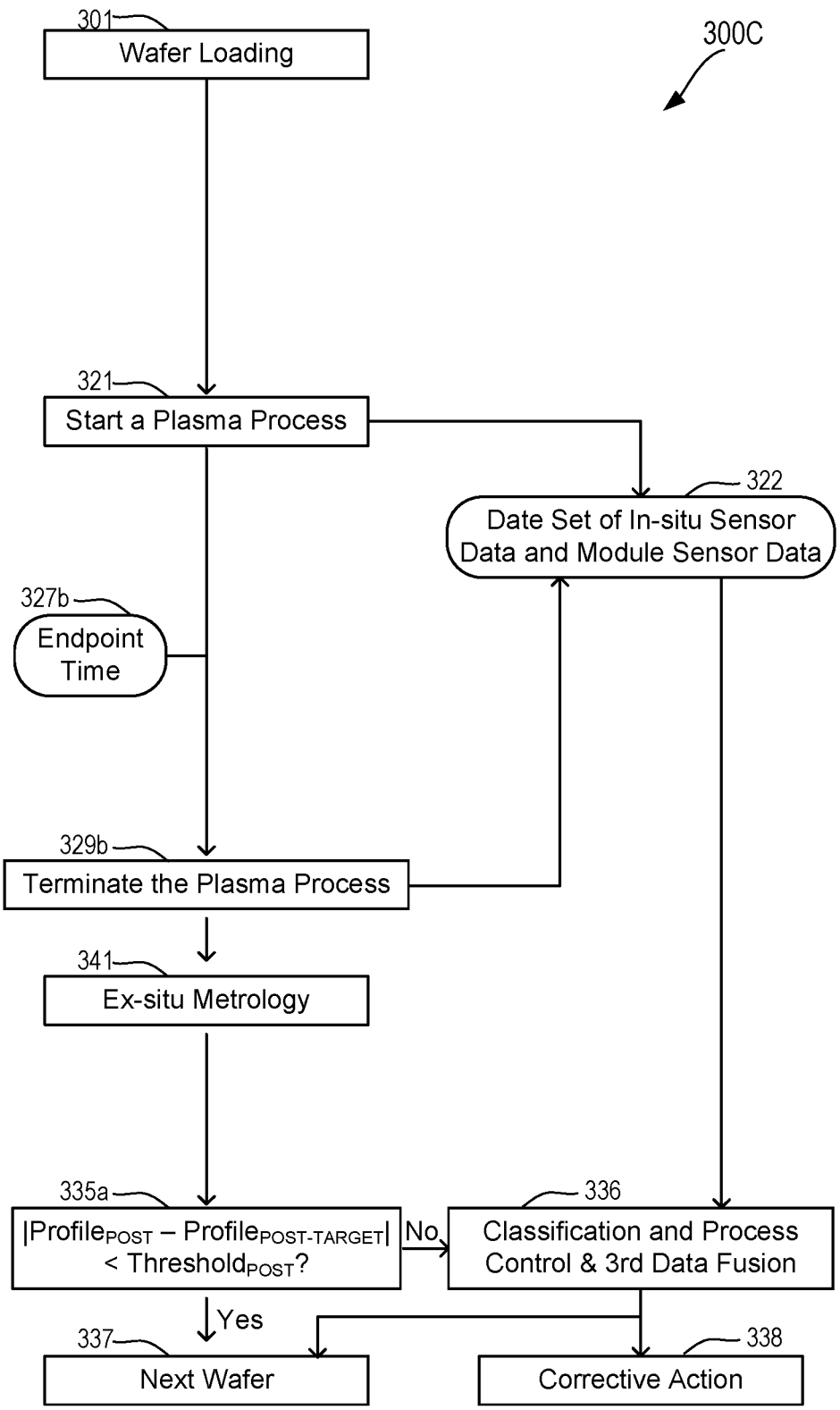
FIG. 3C shows a diagram of a process of autonomous operation of a plasma tool, in accordance with yet another embodiment of the present disclosure.

FIG. 3C shows a diagram of a process 300C of autonomous operation of a plasma tool, in accordance with yet another embodiment of the present disclosure. Since the embodiment of the process 300C is similar to the embodiment of the process 300B, explanations will be given here with emphasis placed on difference.

After Block 301, the plasma (etching) process is executed in Block 321, with no pre-process fault detection (e.g. Blocks 311, 313 and 315) executed in between. After Block 329b, an ex-situ metrology is executed in Block 341, in lieu of the RM measurement in Block 331 and the second data fusion process in Block 333b. The ex-situ metrology includes measuring the post-process profile, Profile$_{POST}$ outside a processing chamber associated with the plasma process, which can for instance be accomplished by an atomic force microscope, a scanning electron microscope, a transmission electron microscope, a profilometer and/or the like. In one example, the ex-situ metrology is performed outside the plasma tool. In another example, the ex-situ metrology is integrated into the plasma tool but located outside the processing chamber, e.g. in a metrology chamber of the plasma tool.

Figure 3D:
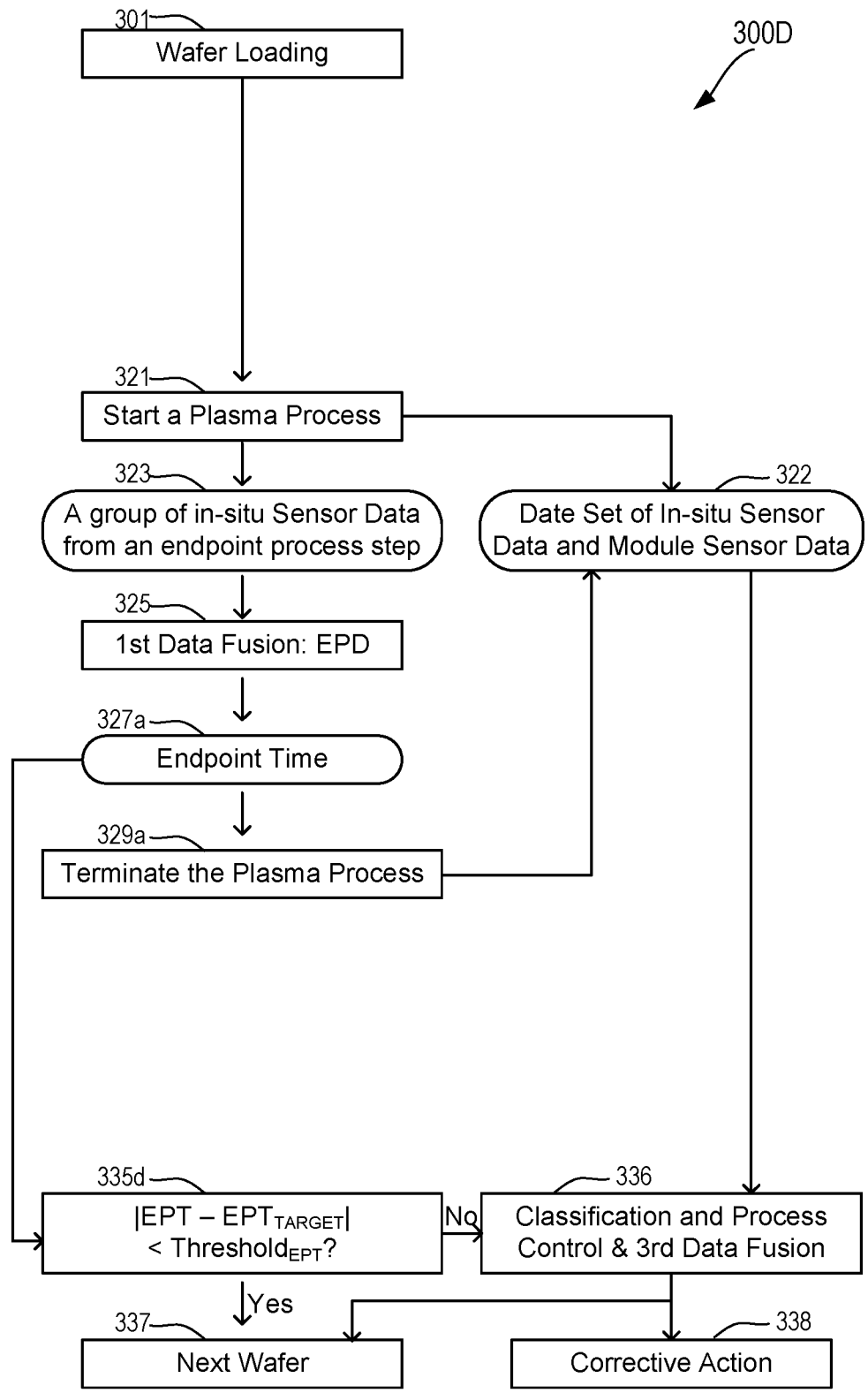
FIG. 3D shows a diagram of a process of autonomous operation of a plasma tool, in accordance with yet another embodiment of the present disclosure.

FIG. 3D shows a diagram of a process 300D of autonomous operation of a plasma tool, in accordance with yet another embodiment of the present disclosure. Since the embodiment of the process 300D is similar to the embodiment of the process 300A, explanations will be given here with emphasis placed on difference.

After Block 301, the plasma (etching) process is executed in Block 321, with no pre-process fault detection (e.g. Blocks 311, 313 and 315) executed in between. Then, the group of in-situ sensor data 323 are used to estimate the endpoint time 327a by the first data fusion process. After Block 329a where the plasma (etching) process is terminated at the endpoint time 327a, no RM measurement or second data fusion process is executed.

In Block 335d, the endpoint time 327a (noted as EPT) is compared with a target endpoint time (noted as EPT$_{TARGET}$). Threshold$_{EPT}$ is a pre-determined threshold value for the endpoint time. If |EPT−EPT$_{TARGET}$|<Threshold$_{EPT}$, the process 300D proceeds to Block 337 by continuing to a next wafer. Otherwise, a fault is detected, and the process 300D proceeds to Block 336.

Referring back to FIG. 2, the controller 230 includes the classification and process control module 231 which may correspond to Block 336 in FIGS. 3A-3D and the classification and process control module 600 in FIG. 6. As mentioned earlier, the controller 230 can also include the control unit 450 in FIG. 4. Further, components of the corresponding plasma tool can be connected to and controlled by the controller 230 that may optionally be connected to a corresponding memory storage unit and user interface (all not shown). Various plasma-processing operations can be executed via the user interface, and various plasma processing recipes and operations can be stored in a storage unit. Accordingly, a given wafer or substrate can be processed within a plasma chamber with various microfabrication techniques.

It will be recognized that the controller 230 may be coupled to various components of the corresponding plasma tool to receive inputs from and provide outputs to the components. For example, the controller 230 can be configured to receive data from sensors (e.g. 210 and 220) together or individually. Specifically, the controller 230 can be configured to receive RM data from the RM 211, OES/MS data from the OES/MS sensor 213 and/or VI data from the VI probe 215. The controller 230 can also be configured to adjust knobs and control settings for the sensors (e.g. 210 and 220) together or individually. Of course the adjustments can be manually made as well.

Since the processes 300A, 300B, 300C and 300D can illustrate four embodiments of autonomous operation of the system 200 in FIG. 2, it will also be recognized that the controller 230 may be coupled to various components of one or more of the processes 300A, 300B, 300C and 300D to receive inputs from and provide outputs to the components. Consider the process 300A for example. The controller 230 can be configured to load the wafer into the plasma tool or transfer the wafer into the chamber in Block 301. The controller 230 can be configured to execute the pre-process fault detection as shown in Blocks 301, 313 and 315. The controller 230 can be configured to start the plasma process in Block 321, execute the first data fusion process in Block 325, obtain/receive the endpoint time 327a and/or terminate the plasma process in Block 329a. As mentioned above, the controller 230 can be configured to receive the group of in-situ sensor data 323 and/or the data set 322. The controller 230 can be configured to execute the post-process fault detection, e.g. the RM measurement in Block 331. The controller 230 can be configured to execute the second fusion process and obtain/receive the post-process profile 334. The controller 230 can be configured to determine whether $|Profile_{POST} - Profile_{POST}|TARGET < Threshold_{POST}$ in Block 335a. The controller 230 can be configured to implement the classification and control module in Block 336 and/or the corrective action in Block 338. It should be understood that one or more of the above-mentioned functions of the controller 230 can be implemented manually as well. Similarly, one or more blocks (or functions) of the processes 300B, 300C and 300D can be implemented by the controller 230 or manually.

The controller 230 can be implemented in a wide variety of manners. In one example, the controller 230 is a computer. In another example, the controller 230 includes one or more programmable integrated circuits that are programmed to provide the functionality described herein. For example, one or more processors (e.g. microprocessor, microcontroller, central processing unit, etc.), programmable logic devices (e.g. complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g. memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

Note that the embodiments described herein focus on a wafer profile (e.g. Profile$_{POST}$ in FIGS. 3A-3C and the post-process profile 334 in FIG. 5) and an endpoint time (e.g. EPT in FIG. 3D) as a wafer state. The wafer profile is only one example of a critical dimension (CD), and the wafer state may also include other examples of CD. Generally speaking, CD can include, but is not limited to, one or more feature dimensions such as width, length, sidewall angle, feature depth, and/or other feature dimensions. For example, with respect to a gate of a transistor device, CD can include top, middle and/or bottom widths of the gate as well as the gate-related width at a height level for other structures associated with the transistor device. Further, CD can include CD profiles which may include one-dimension (1D) features, two-dimensional (2D) features, three-dimensional (3D) features, or any combination thereof.

Additionally, other wafer states can also be used. In some embodiments, an etch rate, etch selectivity, a film deposition rate or other parameters can be used. The etch rate, for example, can be a film removal rate in a selected direction, such as a vertical direction. The etch selectivity, for example, can be a ratio of etch rates for two types of films. The film deposition rate, for example, can be an increase in film thickness per unit time at a selected area of a wafer, such as a center of the wafer. Additionally, the wafer state may include a deposition rate, a film thickness, a film chemical composition, a film reflectivity, a film absorbance, an amount of remaining mask material, film resistivity and/or film conductivity.

In some embodiments, the wafer state is continuous. That is, the wafer state is a numeric state that has an infinite number of values between any two values. For example, the wafer state can include a film thickness, a probability, etc. In some embodiments, the wafer state is non-continuous, e.g. discrete or categorical. Specifically, the wafer state is discrete when the wafer state is a numeric state that has a countable number of values between any two values. The wafer state is categorical when the wafer state includes a finite number of categories or distinct groups. For example, a categorical wafer state can include whether or not an endpoint has been reached.

Note that the plasma tool in the present disclosure may be a capacitively-coupled plasma processing apparatus, inductively-coupled plasma processing apparatus, microwave plasma processing apparatus, Radial Line Slot Antenna (RLSA™) microwave plasma processing apparatus, electron cyclotron resonance (ECR) plasma processing apparatus, or other types of processing systems or combination of systems. Thus, it will be recognized by those skilled in the art that the techniques described herein may be utilized with any of a wide variety of plasma processing systems. The plasma tool can be used for a wide variety of operations including, but not limited to, etching, deposition, cleaning, plasma polymerization, plasma-enhanced chemical vapor deposition (PECVD), atomic layer deposition (ALD), atomic layer etch (ALE), and the like. The structure of a plasma tool is well known to one skilled in the art. It will be recognized that different and/or additional plasma process systems may be implemented while still taking advantage of the techniques described herein.

Figure 7:
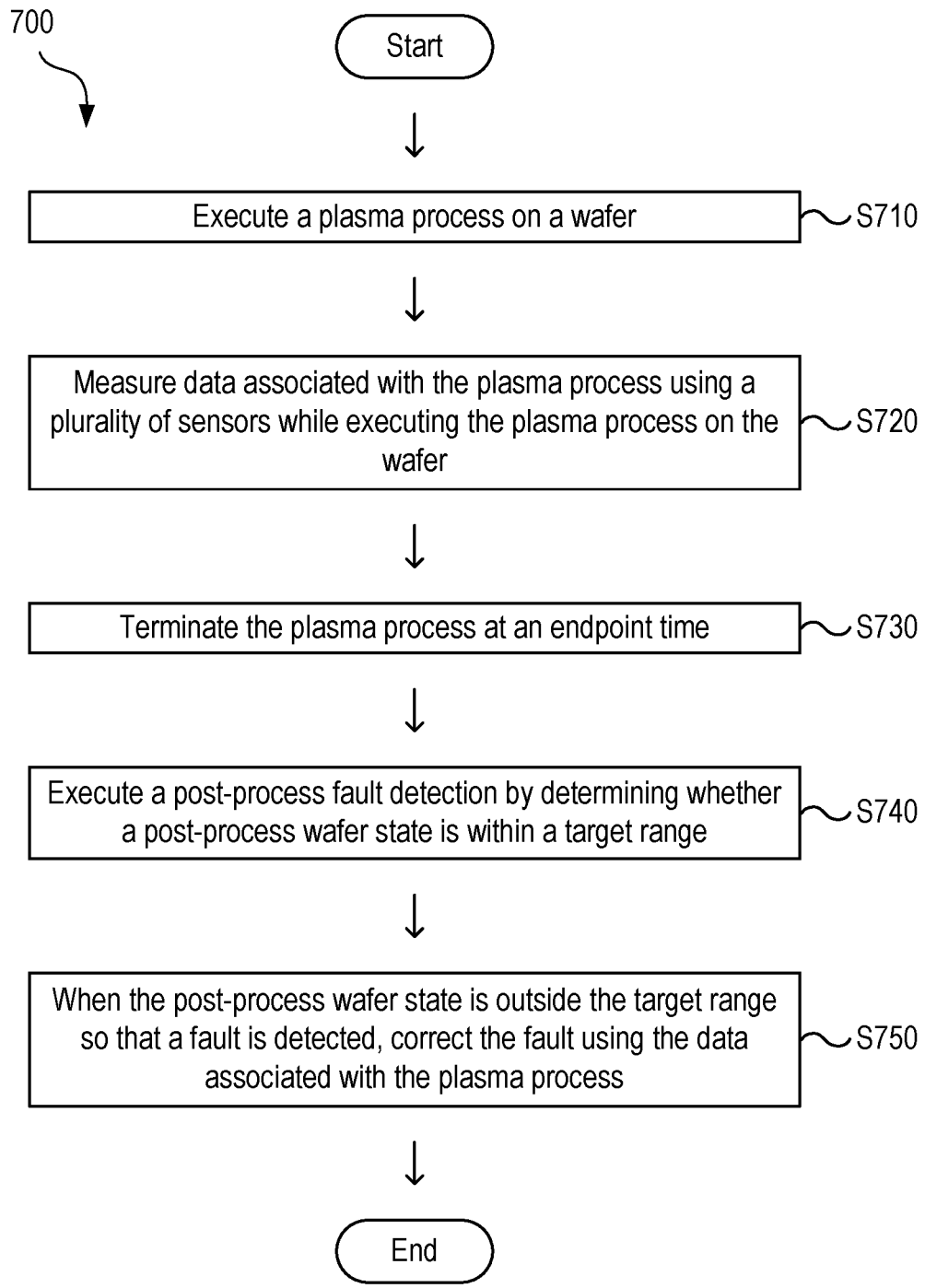
FIG. 7 shows a flow chart of a process of operating a plasma tool, in accordance with some example embodiments of the present disclosure.

FIG. 7 shows a flow chart of a process 700 of operating a plasma tool, such as the plasma tool in FIG. 2, in accordance with some example embodiments of the present disclosure. At Step S710 of the process 700, a plasma process is executed on a wafer. In some embodiments (e.g. FIGS. 3A and 3B), a pre-process fault detection is executed before Step S710, by a wafer measurement (e.g. a reflectometer measurement) to determine whether an initial wafer state (e.g. an initial CD) meets a preset requirement. When the initial wafer state meets the preset requirement, Step S710 is executed.

At Step S720, data (e.g. the data set 322) associated with the plasma process are measured using a plurality of sensors while the plasma process is executed on the wafer. The plurality of sensors can include in-situ sensors and module sensors. In some embodiments (e.g. FIGS. 3A and 3D), the endpoint time is estimated using a group of in-situ sensor data that are measured by a group of in-situ sensors of the plurality of sensors and associated with an endpoint process step of the plasma process. The group of in-situ sensors can include at least two of a spectrometer, an ellipsometer, a scatterometer, a reflectometer (RM), a voltage and current (VI) probe, an optical emission spectrometry (OES) sensor, a plasma sensor, a mass spectrometer (MS) or a radio frequency (RF) sensor. For example, the group of in-situ sensors can include an RM, an OES/MS sensor and a VI probe.

At Step S730, the plasma process is terminated at an endpoint time. In some embodiments (e.g. FIGS. 3A and 3D), the endpoint time is estimated using the group of in-situ sensor data, for example as shown in FIG. 4. In some embodiments (e.g. FIGS. 3B and 3C), the endpoint time is pre-determined, for example determined before the plasma process is executed on the wafer.

At Step S740, a post-process fault detection is executed by determining whether a post-process wafer state is within a target range. In some embodiments (e.g. FIGS. 3A and 3B), the aforementioned wafer measurement is repeated to obtain a first wafer state, after the plasma process is terminated at the endpoint time. A second wafer state is estimated using the initial wafer state and the data associated with the plasma process. The first wafer state and the second wafer state are used to estimate the post-process wafer state, for example as shown in FIG. 5. In some embodiments (e.g. FIG. 3C), the post-process wafer state is (directly) measured outside a processing chamber associated with the plasma process. For example, a CD can be measured ex situ by at least one of an atomic force microscope, a scanning electron microscope, a transmission electron microscope or a profilometer. In some embodiments (e.g. FIG. 3D), the post-process wafer state is an endpoint time.

At Step S750, when the post-process wafer state is outside the target range so that a fault is detected, the fault is corrected using the data associated with the plasma process. In some embodiments, a current failure mode can be identified using a classification model based on fused data. The correcting the fault includes, based on the current failure mode, at least one of adjusting a recipe for the plasma process, executing a seasoning process, performing a cleaning operation, performing maintenance work, replacing a consumable part of the plasma tool or adjusting a temperature in the plasma tool. In some embodiments, the current failure mode is unidentifiable by the classification model. As a result, at least one recipe parameter is adjusted based on the post-process wafer state using a process control model that describes a relationship between the post-process wafer state and the at least one recipe parameter.

Further, it should be understood that any combinations of the embodiments described herein and/or variations can also be implemented while still taking advantage of the techniques described herein. Techniques herein are applicable to a variety of processes in a plasma tool, including but not limited to etching, deposition, cleaning, plasma polymerization, plasma-enhanced chemical vapor deposition (PECVD), atomic layer deposition (ALD), atomic layer etch (ALE), and the like.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of operating a plasma tool, the method comprising:
   executing a plasma process on a wafer;
   measuring data associated with the plasma process using a plurality of sensors while executing the plasma process on the wafer;
   estimating an endpoint time using a group of in-situ sensor data that are measured by a group of in-situ sensors of the plurality of sensors and are associated with an endpoint process step of the plasma process, wherein the estimating the endpoint time comprises
      inputting respective data measured by each in-situ sensor of the group of in-situ sensors into a respective individual endpoint detection (EPD) method to output a respective individual estimate of reaching an endpoint of the plasma process, resulting in a group of individual estimates; and
      inputting the group of individual estimates into an integrated EPD method to output an integrated estimate of reaching the endpoint of the plasma process to estimate the endpoint time;
   terminating the plasma process at the endpoint time;

executing a post-process fault detection to determine that a post-process wafer state is outside a target range so as to detect a fault; and correcting the fault using the data associated with the plasma process.

2. The method of claim 1, further comprising:

executing a pre-process fault detection, before the executing the plasma process on the wafer, by a wafer measurement to determine whether an initial wafer state meets a preset requirement; and executing the plasma process on the wafer when the initial wafer state meets the preset requirement.

3. The method of claim 2, further comprising:

repeating the wafer measurement, after the terminating the plasma process at the endpoint time, to obtain a first wafer state.

4. The method of claim 3, further comprising:

estimating a second wafer state using the initial wafer state and the data associated with the plasma process.

5. The method of claim 4, further comprising:

obtaining a duration of the plasma process by estimating the endpoint time using a group of in-situ sensor data that are measured by a group of in-situ sensors of the plurality of sensors and are associated with an endpoint process step of the plasma process; and obtaining a process rate by using a virtual metrology (VM) model that is configured to estimate the process rate using the data associated with the plasma process.

6. The method of claim 5, wherein:

the plasma process comprises a plasma etching process, the duration of the plasma process comprises an etch duration, the process rate comprises an etch rate, and the second wafer state comprises a second critical dimension (CD) that is estimated using an initial CD, the etch duration and the etch rate.

7. The method of claim 4, further comprising:

obtaining the post-process wafer state using an integrated estimation method that is configured to estimate the post-process wafer state using the first wafer state and the second wafer state.

8. The method of claim 3, further comprising:

measuring a reflectivity of the wafer by the wafer measurement;

providing a test model that estimates a CD based on the reflectivity;

obtaining the initial wafer state using the test model, wherein the initial wafer state comprises an initial CD; and obtaining the first wafer state using the test model, wherein the first wafer state comprises a first CD.

9. The method of claim 1, further comprising:

measuring the post-process wafer state outside a processing chamber associated with the plasma process.

10. The method of claim 9, wherein the measuring the post-process wafer state comprises:

measuring a CD ex situ by at least one of an atomic force microscope, a scanning electron microscope, a transmission electron microscope or a profilometer.

11. The method of claim 1, wherein:

the group of in-situ sensors comprises at least two of a spectrometer, an ellipsometer, a scatterometer, a reflectometer, a voltage and current (VI) probe, an optical emission spectrometry (OES) sensor, a plasma sensor, a mass spectrometer (MS) or a radio frequency (RF) sensor.

12. The method of claim 1, wherein the correcting the fault comprises:

identifying a current failure mode using a classification model based on fused data, the fused data comprising the data associated with the plasma process, the classification model configured to identify a plurality of failure modes associated with the plasma tool.

13. The method of claim 12, wherein:

the correcting the fault comprises, based on the current failure mode, at least one of adjusting a recipe for the plasma process, executing a seasoning process, performing a cleaning operation, performing maintenance work, replacing a consumable part of the plasma tool or adjusting a temperature in the plasma tool.

14. The method of claim 12, wherein:

the correcting the fault comprises, when the current failure mode is unidentifiable by the classification model, adjusting at least one recipe parameter based on the post-process wafer state using a process control model that describes a relationship between the post-process wafer state and the at least one recipe parameter.

15. The method of claim 1, wherein:

the post-process wafer state comprises at least one of a critical dimension (CD), an etch rate, etch selectivity, an amount of remaining mask material, a deposition rate, a film thickness, a film chemical composition, a film reflectivity, film absorbance, film resistivity, film conductivity or the endpoint time.

16. A method of operating a plasma tool, the method comprising:

executing a plasma process on a wafer;

measuring data associated with the plasma process using a plurality of sensors while executing the plasma process on the wafer;

terminating the plasma process at an endpoint time;

executing a post-process fault detection to determine that a post-process wafer state is outside a target range so as to detect a fault;

correcting the fault using the data associated with the plasma process, wherein the correcting the fault comprises identifying a current failure mode using a classification model based on fused data, the fused data comprising the data associated with the plasma process, the classification model configured to identify a plurality of failure modes associated with the plasma tool;

inputting respective data measured by each sensor of the plurality of sensors into a respective individual estimation method to output a respective individual wafer state of the wafer, resulting in a plurality of individual wafer states;

arranging the plurality of individual wafer states into groups;

inputting each group into a respective integrated estimation method to output a respective integrated wafer state of the wafer, resulting in a plurality of integrated wafer states; and adding the plurality of individual wafer states and the plurality of integrated wafer states to the fused data.

17. The method of claim 16, further comprising:

determining the endpoint time before the executing the plasma process on the wafer.

18. The method of claim 16, further comprising:

estimating the endpoint time using a group of in-situ sensor data that are measured by a group of in-situ sensors of the plurality of sensors and are associated with an endpoint process step of the plasma process.

19. The method of claim 18, further comprising:
inputting respective data measured by each in-situ sensor of the group of in-situ sensors into a respective individual endpoint detection (EPD) method to output a respective individual estimate of reaching an endpoint of the plasma process, resulting in a group of individual estimates; and
inputting the group of individual estimates into an integrated EPD method to output an integrated estimate of reaching the endpoint of the plasma process to estimate the endpoint time.

* * * * *